United States Patent
Pajukoski et al.

(10) Patent No.: US 9,887,803 B2
(45) Date of Patent: Feb. 6, 2018

(54) ERROR CORRECTION CODING SCHEME ON A FREQUENCY BAND COMPRISING SUB-BANDS

(71) Applicant: NOKIA SOLUTIONS AND NETWORKS OY, Espoo (FI)

(72) Inventors: Kari Pekka Pajukoski, Oulu (FI); Olav Tirkkonen, Helsinki (FI); Esa Tapani Tiirola, Kempele (FI); Kari Juhani Hooli, Oulu (FI); Pasi Eino Tapio Kinnunen, Oulu (FI)

(73) Assignee: Nokia Solutions and Networks Oy, Espoo (FI)

( * ) Notice: Subject to any disclaimer, the term of this patent is extended or adjusted under 35 U.S.C. 154(b) by 104 days.

(21) Appl. No.: 14/759,389

(22) PCT Filed: Mar. 25, 2013

(86) PCT No.: PCT/EP2013/056274
§ 371 (c)(1),
(2) Date: Jul. 6, 2015

(87) PCT Pub. No.: WO2014/154237
PCT Pub. Date: Oct. 2, 2014

(65) Prior Publication Data
US 2015/0341141 A1 Nov. 26, 2015

(51) Int. Cl.
*H04L 1/00* (2006.01)
*H04W 52/24* (2009.01)
(Continued)

(52) U.S. Cl.
CPC ............ *H04L 1/0041* (2013.01); *G06F 11/10* (2013.01); *H03M 13/353* (2013.01); *H04L 1/009* (2013.01); *H04L 1/0015* (2013.01); *H04L 1/0033* (2013.01); *H04L 1/0045* (2013.01); *H04L 1/0057* (2013.01); *H04L 5/006* (2013.01);
(Continued)

(58) Field of Classification Search
None
See application file for complete search history.

(56) References Cited

U.S. PATENT DOCUMENTS

| | | | |
|---|---|---|---|
| 7,492,701 B2 * | 2/2009 | Song | H04L 1/0003 370/208 |
| 7,894,540 B2 * | 2/2011 | Wilhelmsson | H04L 5/0048 375/222 |

(Continued)

OTHER PUBLICATIONS

International Search Report and Written Opinion for International Application No. PCT/EP2013/056274, dated Jan. 30, 2014, 8 pages.

*Primary Examiner* — Justin R Knapp
(74) *Attorney, Agent, or Firm* — Brake Hughes Bellermann LLP

(57) ABSTRACT

Improved adaptation to a frequency band comprising sub-bands is provided by receiving a coding rate of an error correction coding scheme for encoding modulation symbols to be transmitted on sub-bands of a frequency band in radio communications, determining relative radio channel qualities of the sub-bands of the frequency band, and allocating transmission power between the sub-bands at least on the basis of the relative radio channel qualities of the sub-bands and the received coding rate.

18 Claims, 7 Drawing Sheets

(51) Int. Cl.
*H03M 13/35* (2006.01)
*G06F 11/10* (2006.01)
*H04L 5/00* (2006.01)
*H04W 52/26* (2009.01)

(52) U.S. Cl.
CPC .......... *H04L 5/0023* (2013.01); *H04L 5/0046* (2013.01); *H04L 5/0064* (2013.01); *H04W 52/241* (2013.01); *H04W 52/262* (2013.01); *H04W 52/265* (2013.01)

(56) References Cited

U.S. PATENT DOCUMENTS

| | | | | |
|---|---|---|---|---|
| 8,249,179 B2* | 8/2012 | Onodera | ............... | H04L 1/0026 370/252 |
| 8,311,573 B1* | 11/2012 | Dinan | ................. | H04W 52/262 455/135 |
| 8,355,360 B2* | 1/2013 | Yang | ................... | H04W 52/143 370/318 |
| 8,401,036 B2* | 3/2013 | Chandra | ............... | H04L 1/0002 370/229 |
| 8,638,736 B2* | 1/2014 | Lee | ....................... | H04L 5/0007 370/329 |
| 8,861,632 B2* | 10/2014 | Ozluturk | ............... | H04L 5/0025 370/203 |
| 9,363,766 B2* | 6/2016 | Zhou | .................... | H04W 52/40 |
| 2006/0034164 A1 | 2/2006 | Ozluturk | | |
| 2008/0259802 A1* | 10/2008 | Pedersen | ............... | H04L 5/0037 370/235 |
| 2010/0158146 A1* | 6/2010 | Hamaguchi | ........... | H04L 5/0094 375/260 |
| 2011/0255505 A1* | 10/2011 | Liu | ....................... | H04L 5/0007 370/330 |
| 2015/0085767 A1* | 3/2015 | Einhaus | ................ | H04L 1/0001 370/329 |
| 2015/0131545 A1* | 5/2015 | Ameigeiras Gutierrez | .......................... | H04W 72/087 370/329 |

* cited by examiner

ERROR CORRECTION CODING SCHEME ON A FREQUENCY BAND COMPRISING SUB-BANDS

This application is a national stage entry of PCT Application No. PCT/EP2013/056274, filed on Mar. 25, 2013, entitled "ERROR CORRECTION CODING SCHEME ON A FREQUENCY BAND COMPRISING SUB-BANDS", which is hereby incorporated by reference in its entirety.

FIELD

The present invention relates to communications on a radio channel comprising a plurality of sub-bands and more particularly to the use of an error correction coding scheme in the communications.

BACKGROUND

The following description of background art may include insights, discoveries, understandings or disclosures, or associations together with disclosures not known to the relevant art prior to the present invention but provided by the invention. Some such contributions of the invention may be specifically pointed out below, whereas other such contributions of the invention will be apparent from their context.

The present commercial wireless communications systems employ radio frequencies for communications between base stations and mobile phones. Currently the fourth generation (4G) of the wireless communications systems are increasingly deployed and used. The 4G systems provide mobile ultra-broadband Internet access, for example to laptops with Universal Serial Bus (USB) wireless modems, to smartphones, and to other mobile devices.

The International Telecommunications Union-Radio communications sector (ITU-R) have specified a set of requirements for 4G wireless communications standards, named the International Mobile Telecommunications Advanced (IMT-Advanced) specification. The IMT-Advanced defines peak speed requirements for a 4G service at 100 megabits per second (Mbit/s) for high mobility communication (such as from trains and cars) and 1 gigabit per second (Gbit/s) for low mobility communication (such as pedestrians and stationary users).

The first-release versions of Mobile Worldwide Interoperability for Microwave Acces (WiMAX) and the Long Term Evolution (LTE) defined by the Third Generation Partnership Project (3GPP) support much less than 1 Gbit/s peak bit rate, they are not fully IMT-Advanced compliant, but are often branded 4G by service providers.

Beyond 4G (B4G) radio systems are currently being developed. These systems are envisaged to be commercially available in the following decades. The Orthogonal Frequency Division Multiple Access (OFDMA) is the strongest candidate for the access method in the B4G system.

It is foreseen that the cell sizes of the B4G systems are smaller and have significantly higher spectrum efficiency than the present systems. It would be desirable to increase the spectrum efficiency especially in terms of increasing the efficiency of the net information transferred per a unit of spectrum.

When error correction coding, for example Forward Error Correction coding (FEC), is used in wireless transmissions, spectral efficiency can be increased by using a higher coding rate, i.e. a proportion of net information, k, per gross information, n, generated in the coding. The coding rate is conventionally denoted as the ratio of the net and gross information, k/n, e.g. 3 bits/4 bits. The spectral efficiency can be measured in bits/s/Hz.

Different modulation schemes may be used to modulate a radio frequency carrier. The used modulation scheme defines a number of bits to be used per each modulation symbol. Accordingly, the selection of the modulation scheme can also be made such that the spectral efficiency is optimized.

Various modulation and error correction coding schemes may be defined into a set of combinations of Modulation and Coding Schemes (MCSs), such as in the LTE systems, where MCSs are defined for example in 3GPP TS 36.213 Physical Layer Procedures v 10.8.0 Chapter 7.1.7.1.

In LTE, subcarriers that are allocated as transmission resources to User Equipment (UE) in a certain transmission time instant use the same MCS and transmission power. On the other hand in downlink, the transmission power for different subcarriers is determined by the base station, i.e. eNodeB in LTE networks. Accordingly, the different characteristics of the radio channels of the subcarriers are not considered.

On the other hand, with dense deployment needed for the high spectrum efficiency requirement of the B4G systems, the number of UE is roughly the same as the number of cells of the B4G system. Accordingly, a typical number of allocated frequency resources for a single UE in a B4G system could be high and close to the maximum system bandwidth.

Resource allocation with wide frequency bandwidth means that the channel likely fades within the allocated resources. Since OFDMA has no built-in diversity, its performance is very dependent on the coding rate. When a high coding rate is employed for the allocated resources, OFDMA performs poorly because coding does not manage to compensate the influence of weak subcarriers. Then, one deep fade or strong interference can result in that the whole packet needs to be re-transmitted. Therefore, in order to maintain OFDMA performance in the B4G system, the MCS of a B4G system should be selected according to the worst sub-carries on the bandwidth. However, this would not facilitate maintaining high spectrum efficiency.

SUMMARY

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to a more detailed description that is presented later.

Various embodiments comprise method(s), apparatus(es), a computer program product and a system as defined in the independent claims. Further embodiments are disclosed in the dependent claims.

According to an aspect of the invention there is provided a method comprising receiving a coding rate of an error correction coding scheme for encoding modulation symbols to be transmitted on sub-bands of a frequency band in radio communications, determining relative radio channel qualities of the sub-bands of the frequency band, and allocating transmission power between the sub-bands at least on the basis of relative radio channel qualities of the sub-bands and the received coding rate.

According to an aspect there is provided an apparatus comprising means configured to perform a method according to an aspect.

According to an aspect there is provided an apparatus comprising a receiver to receive a coding rate of an error correction coding scheme for encoding symbols to be transmitted on sub-bands of a frequency band in radio communications, a channel quality determiner to determine relative radio channel qualities of the sub-bands of the frequency band, and a transmission power allocator to allocate transmission power between the sub-bands at least on the basis of relative radio channel qualities of the sub-bands and the received coding rate.

According to an aspect there is provided a computer program product comprising executable code that when executed, cause execution of functions of a method according to an aspect.

According to an aspect there is provided a communications system comprising one or more apparatuses according to an aspect.

According to another aspect of the invention there is provided an arrangement comprising at least one processor, and at least one memory including computer program code, the at least one memory and the computer program code configured to, with the at least one processor, cause the apparatus at least to perform a method according to an aspect.

Although the various aspects, embodiments and features of the invention are recited independently, it should be appreciated that all combinations of the various aspects, embodiments and features of the invention are possible and within the scope of the present invention as claimed.

Some embodiments may provide improvements comprising one or more from improved accuracy of link adaptation, improved coverage of radio transmissions, improved power efficiency, improved spectrum efficiency. The improvements are achieved, while keeping the signalling at a reasonable level.

Further advantages will become apparent from the accompanying description.

BRIEF DESCRIPTION OF THE FIGURES

In the following the invention will be described in greater detail by means of preferred embodiments with reference to the accompanying drawings, in which.

DETAILED DESCRIPTION OF SOME EMBODIMENTS

Figure 1:
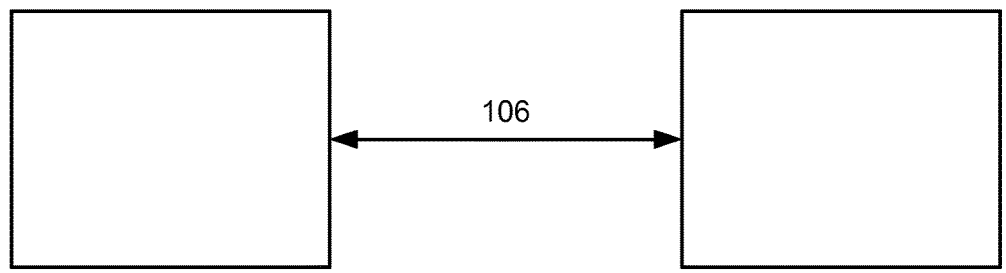
FIG. 1 illustrates an arrangement for wireless communications according to an embodiment.

FIG. 1 illustrates an arrangement for wireless communications according to an embodiment. In the illustration, two devices 102, 104 communicate over a wireless medium 106. The communications may include wireless transmissions in one direction or in both directions between the devices. The devices are configured such that a transmission of one device on the wireless medium may be received by the other device. Accordingly, the devices are arranged to operate as a transmitter and a receiver on the wireless medium. For this purpose the devices may implement a transmitter unit that communicates data, messages and/or signalling to the wireless medium 106 and a receiver unit that communicates data messages and/or signalling from the wireless medium. The wireless medium may comprise a radio frequency band, whereby the transmitter and the receiver communicate by using radio frequency signals. It should be appreciated that both of the devices may operate as both a transmitter and a receiver. The transmitter and receiver operations may be implemented by hardware or software or a combination of hardware and software.

The configuration of the devices may be achieved by the devices implementing one or more entities of a common communications protocol. The common communications protocol may be implemented by structural parts, for example the transmitter and the receiver both having radio frequency parts that are operative on the frequency band used for the communications. Examples of the radio frequency parts include antennas, and modulation and demodulation circuits.

A common communications protocol between the devices may be implemented at the devices by instructions, for example computer program code, that are executable by a processor so that data, messages and/or signalling can be encoded according to a communications protocol at the transmitter and decoded according to the communications protocol at the receiver. The instructions may be stored in a memory. The communications device may include a processing unit that may execute the instructions.

Figure 2:
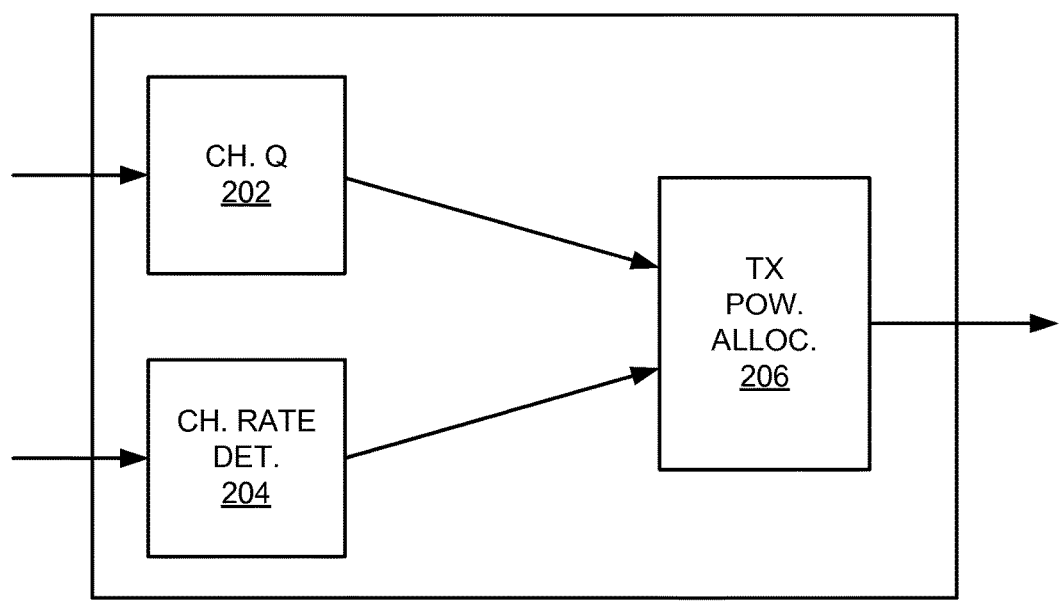
FIG. 2 illustrates a block diagram of an apparatus for allocating transmission power according to an embodiment.

FIG. 2 illustrates a block diagram of an apparatus for allocating transmission power according to an embodiment. The apparatus 200 may be a module suitable to be used in a communications device of FIG. 1 for allocating transmission power to transmission on a wireless medium.

The apparatus 200 comprises a coding rate determiner 204, a channel quality determiner 202 and a transmission power allocator 206 which are communicatively connected to each other. The coding rate determiner determines a coding rate of an error correction coding scheme for encoding modulation symbols to be transmitted on sub-bands of a frequency band in radio communications. The coding rate may be determined from information of an error correction coding scheme used for the symbols. This information may be received by the coding rate determiner from a coding scheme selection process and/or from control signalling. The coding scheme selection process may be executed as conventional in communication devices according to Global System for Mobile Communications (GSM), Universal Mobile Telecommunications System (UMTS), LTE, WiMax, and procedures known from commercially available mobile phones conforming to those standards. The control signalling may comprise e.g. control signalling exchanged between a NodeB and UE, as is conventional in LTE networks.

The channel quality determiner may determine an attenuation and/or interference on a radio channel. The determination may be made on the basis measurements of channel quality. These measurements may be made by the channel quality determiner or received by the channel quality determiner, for example from channel estimation unit. The channel quality measurements may be performed according to a process for measuring channel quality. The process may be defined by a communications standard, for example by the above communications standards. The channel quality may be determined for a specific radio channel. The radio channel may comprise a radio channel allocated as a resource for transmission on the frequency band. The channel quality determiner may utilize information of the allocated resource and determine the radio channel quality on the allocated resource or resources.

The channel quality determiner may determine channel qualities of a plurality of radio channels, e.g. sub-bands. Then the radio channel qualities of the sub-bands may be determined as relative radio channel qualities, where the channel qualities of the sub-bands are relative to each other.

In one example operation, information indicating an allocated radio channel is received in a signalling message from a NodeB to UE, as is conventional in LTE networks.

The transmission power allocator receives channel quality information from the channel quality determiner and the determined coding rate from the coding rate determiner. The transmission power allocator controls allocation of transmission power between sub-bands of the frequency band. The control may comprise a power level of transmission power to be used on a specific sub-band or specific sub-bands in allocated bandwidth or a portion of transmission power to allocate on a specific sub-band.

It should be appreciated that the blocks of the apparatus in FIG. 2 illustrate logical blocks and the actual physical implementation may be different. The logical blocks may be implemented by hardware, software and/or a combination of hardware and software entities.

Figure 3:
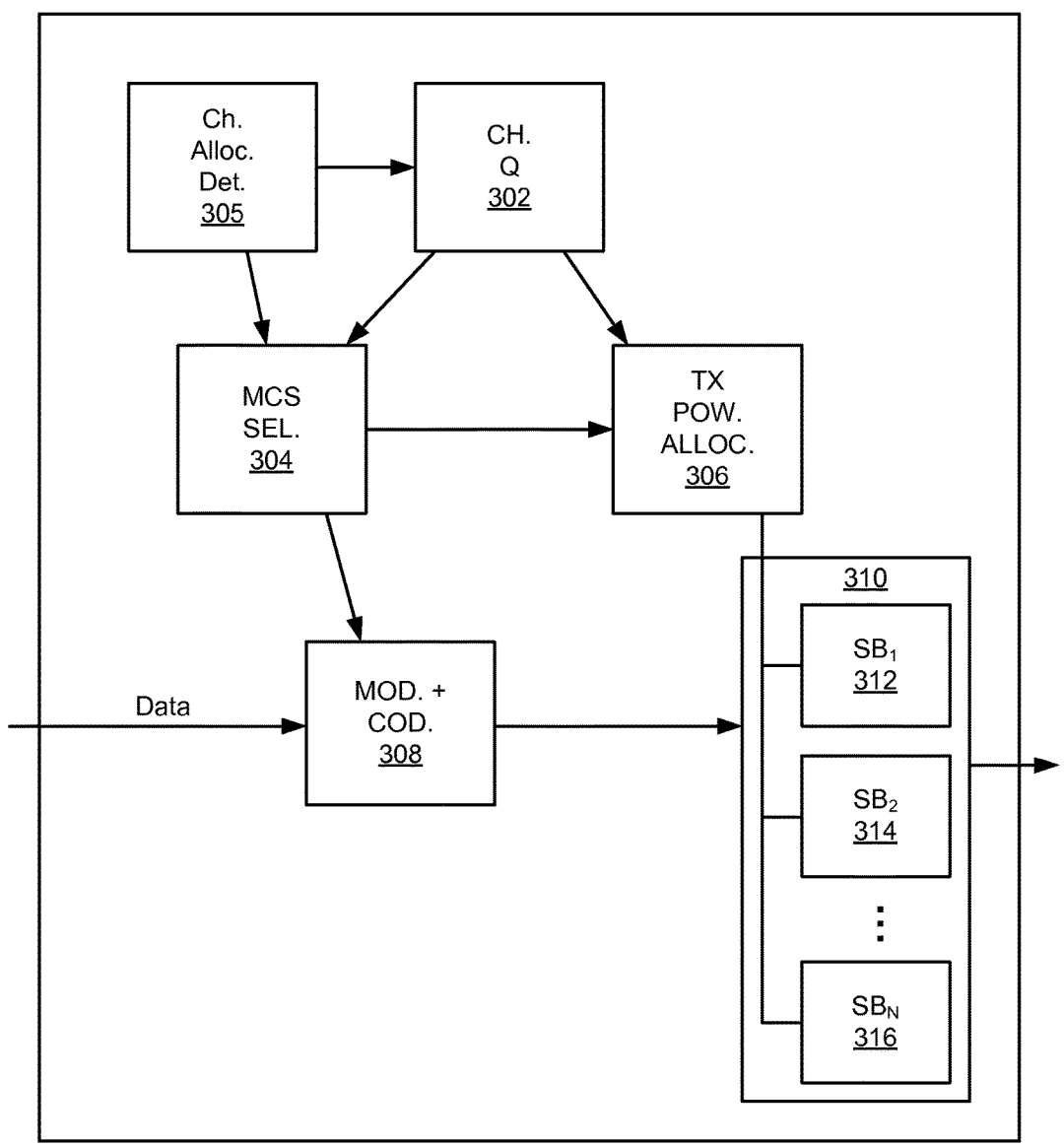
FIG. 3 illustrates a block diagram of an apparatus, where transmission power is allocated to sub-bands on the basis of a coding rate.

FIG. 3 illustrates a block diagram of an apparatus 300, where transmission power is allocated to sub-bands on the basis of a coding rate. The apparatus implements the functionality of the apparatus of FIG. 2 to allocate transmission power to sub-bands of a transmission frequency band on the basis of a coding rate used of for the transmitted symbols. The apparatus 300 comprises a modulation and coding scheme determiner 304, a channel quality determiner 302, channel allocation determiner 305, a transmission power allocator 306, a modulation and coding unit 308 and a transmitter unit 310. The transmitter unit includes sub-band units 312, 314 and 316 that control transmission power of symbols on a specific sub-band. The transmitter unit receives encoded symbols for transmission on the sub-bands. The symbols are allocated to the sub-bands according to a resource allocation.

The modulation and coding scheme determiner provides the information on the coding rate in determiner 204 of FIG. 2. Additionally, the modulation and coding scheme determiner is connected to the channel quality determiner, to receive information of channel quality on the sub-bands, and to the channel allocation determiner, to receive information of one or more allocated resources on the frequency band.

In one example, the modulation and coding scheme determiner may select a modulation and coding scheme to be used for a transmission of data on the sub-bands. The selection may be made on the basis of the channel quality information and/or on the basis of information of the allocated resources, for example. The modulation and coding scheme determiner also connects to the modulation and coding unit to control the modulation and coding unit to modulate and encode data according to the selected modulation and coding scheme.

The modulation and coding unit receives data to be transmitted and encodes the received data. The modulation and encoding unit outputs encoded data symbols according to the determined modulation scheme. The encoded data symbols are fed to the transmitter unit.

The channel quality determiner may provide the functionality of the channel quality determiner 202 of FIG. 2. Additionally, the channel quality determiner may connect to the modulation and coding scheme detector to provide information of the channel quality of the sub-bands, and to the channel allocation determiner to receive information of one or more allocated resources on the frequency band.

The transmission power allocator connects to the sub-band units so as to control an amount of transmission power used on each of the sub-bands.

The channel allocation determiner determines one or more allocated resources on the frequency band. The resources may comprise a block of resources defined by a combination for one or more from a frequency, time and a code. Accordingly, the channel allocation determiner may determine allocated radio resources. In one example the allocated resources comprise a sub-band allocated for a specific time period, for example a Physical Resource Block comprising 12 subcarriers that are allocated for a time period of two time slots, 1 ms, as in the current LTE networks. In one example, the channel allocation determiner may determine allocated resources on the basis of information received in a signalling message from a NodeB to UE, as is conventional in LTE networks.

It should be appreciated that the modulation and coding scheme determiner 304, channel quality determiner 302 and the transmission power allocator 306 constitute a module that can be connected to the modulation and coding unit 308, the channel allocation determiner and the transmitter unit 310. Such a module can be constructed form the apparatus 200 illustrated in FIG. 2, where the parts of the apparatus 200 are supplemented with the above explained functionality.

Figure 4:
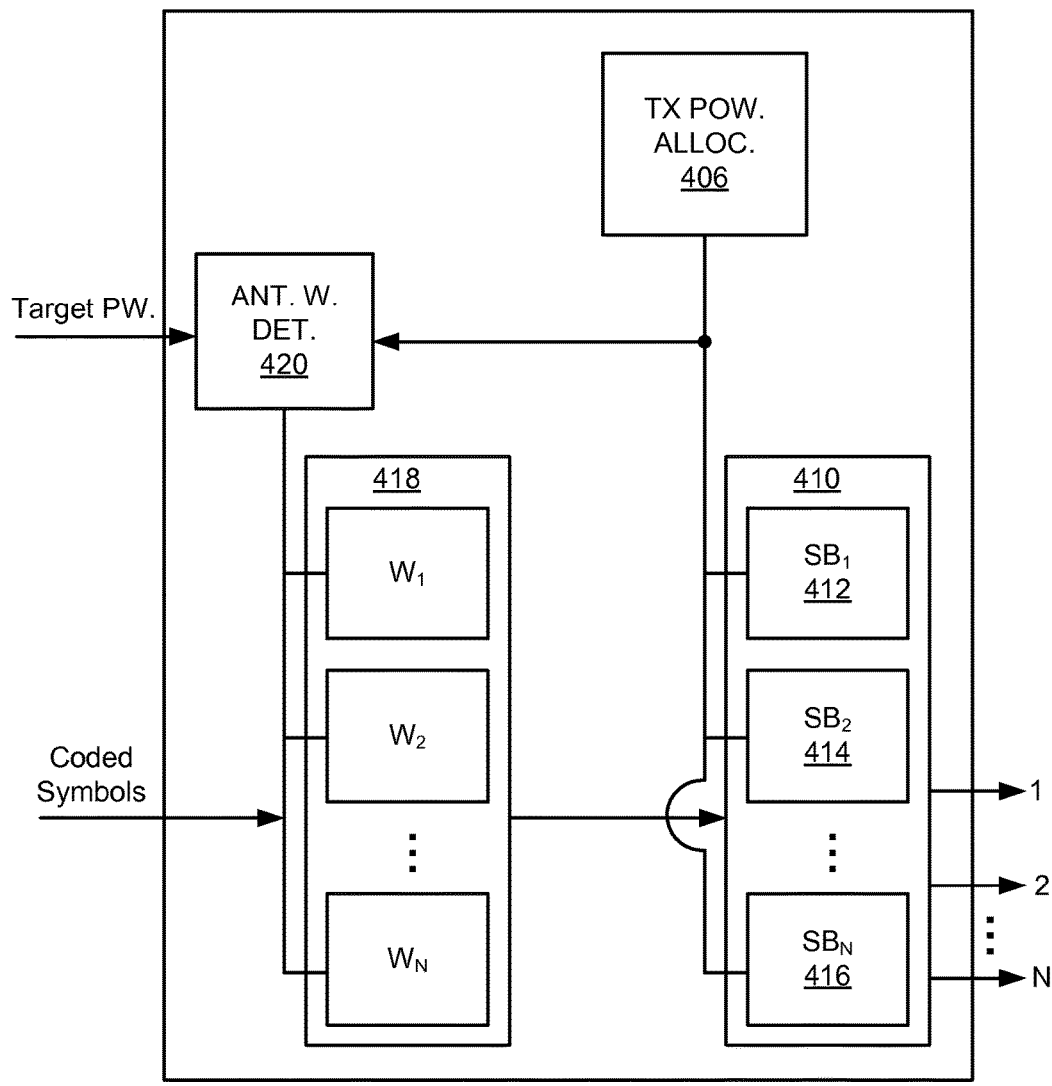
FIG. 4 illustrates a block diagram of an apparatus having a plurality of antennas, wherein transmission power is allocated to sub-bands on the basis of a coding rate and antenna weights are determined on the basis of the power allocation to sub-bands.

Output and input to the apparatuses illustrated in FIGS. 2, 3 and 4 may be arranged by direct electrical connections, a bus and/or via a memory area that is accessible to the apparatus for reading and writing operations.

FIG. 4 illustrates a block diagram of an apparatus 400 having a plurality of antennas (1, 2, . . . , N), wherein transmission power is allocated between sub-bands on the basis of channel qualities and a coding rate of the sub-bands, and antenna weights are determined on the basis of the power allocation to sub-bands. The apparatus comprises a transmission power allocator 406, antenna weight determiner 420, weighting unit 418 and a transmitter 410. The transmission power allocator and transmitter may correspond to those described with FIG. 2 or FIG. 3, with the difference that the transmitter in FIG. 4 controls transmission power of a plurality of antennas communicating on the sub-bands. Accordingly, each of the sub-band units 412, 414, 416 controls transmission power of symbols transmitted via the plurality of antennas.

The antenna weight determiner is connected to the transmission power allocator to receive information of allocated transmission power to specific sub-bands. The antenna weight determiner may also receive information of a target reception power level. This information may be obtained from a radio link signalling message between communicating devices, for example a mobile phone, relay station and a base station, such as a NodeB in LTE networks. Accordingly, the target reception power level may be obtained, from a decoded radio link signalling message. According to one example in the context of LTE networks, a target reception power level may be obtained from a NodeB to UE as described in 3GPP TS 36.213 Physical Layer Procedures v 10.8.0 Chapter 5.1.2.1.

The antenna weight determiner is connected to the weighting unit that applies the antenna weights received from the antenna weight determiner to encoded symbols received at the weighting unit. The encoded symbols may be received from a modulation and coding unit, for example the modulation and coding unit of FIG. 3. The received encoded symbols may be processed into parallel streams corresponding to the antennas in the modulation and encoding unit or the symbols may be separated into antenna-specific streams in the antenna weighting unit. The antenna weighting unit outputs encoded symbols to the transmitter unit that allocates them for transmission to the sub-band units.

In the following processes for allocating transmission power according to embodiments are described. The processes maybe executed by an apparatus described above, when the apparatus is installed to a communications device, for example a UE of a cellular communications network. In the communications device, several coding schemes of error correction coding may be used to encode data transmitted on a radio frequency band. Examples of the error correction coding schemes include a forward error correction coding scheme, for example at least one from a group comprising a block code, a convolutional code and a turbo code. The communications device may conform to a communications standard as described above and use the coding schemes define by the standard.

Figure 5:
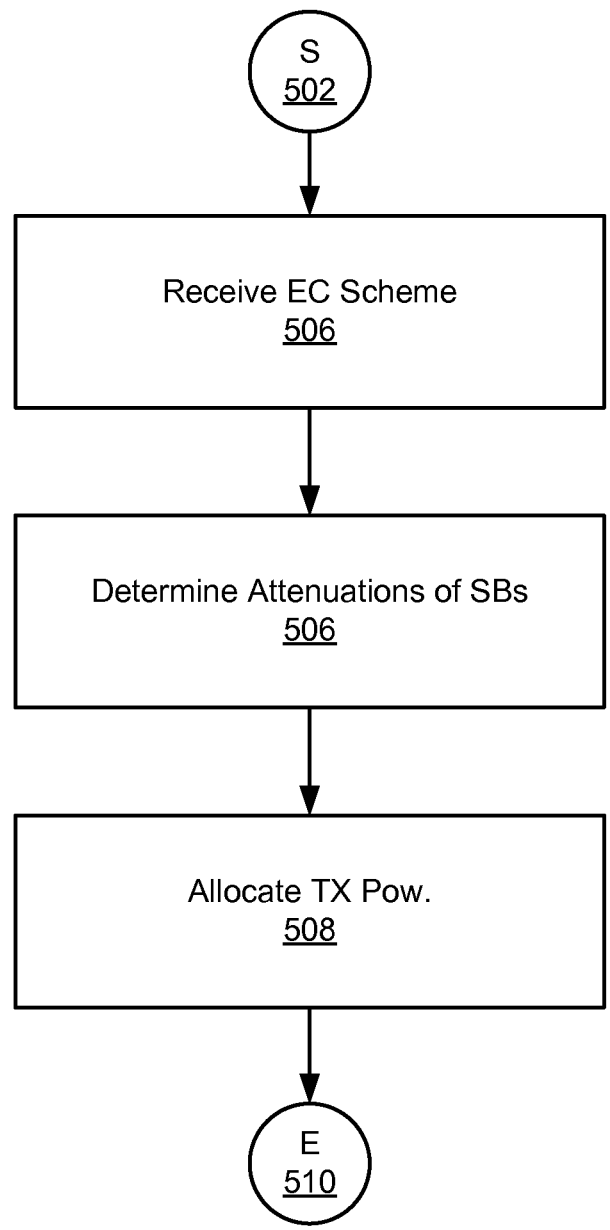
FIG. 5 illustrates a process of allocating transmission power to sub-bands according to an embodiment.

FIG. 5 illustrates a process of allocating transmission power to sub-bands according to an embodiment. The process starts 502, when the communications device is operational and data to be transmitted is encoded according to a coding scheme determined from a plurality of coding schemes.

In 504 information of a coding scheme used to encode data to be transmitted is received. The information may comprise a coding rate k/n. The data may comprise symbols according to a modulation scheme, including for example Binary Phase Shift Keying (BPSK), Quadrature Phase Shift Keying (QPSK) and Quadrature Amplitude Modulation.

In 506 radio channel qualities of sub-bands of the frequency band are determined. The sub-bands may comprise sub-bands are arranged around subcarriers in an Orthogonal Frequency Division Multiplexed frequency band. Accordingly, a sub-band may comprise a plurality of subcarriers.

A radio channel quality may comprise attenuation and/or an interference level on a specific sub-band. The channel qualities may be measured using conventional processes that may be defined by a communications standard employed by the UE. The determined channel qualities may comprise a determining one or more sub-bands that have a low channel quality and one or more sub-bands that have a high channel quality.

In an embodiment the radio channel quality of the sub-bands may comprise relative radio channel qualities between the sub-bands, where radio channel qualities of the sub-bands are defined relative to each other. The relative radio channel qualities may be obtained by comparing the radio channel qualities of different sub-bands against each other. A relative radio channel quality may be expressed e.g. in dB. In one example, a relative radio channel qualitity of a sub-band may indicate e.g. 10 dB higher signal quality than that of another sub-band.

In an embodiment, the measurements are performed from received transmissions in a Time Division Duplex communications frame. In TDD communications frame comprises separate time periods, for example time slots, for reception and transmission of data. The time period may not follow each other immediately, but be separated by one or more time slots belonging to further TDD frames. In the context of cellular communications networks, the received communications are conventionally called downlink transmissions from a base station to the UE, and the transmitted communications are conventionally called uplink transmissions from the UE to the base station. Typically the length of the TDD communications frame is short enough to allow radio channel reciprocity, whereby it may be considered that the radio channel does not change within the TDD frame. Accordingly, a radio channel quality may be measured from a transmission received in the reception time period that precedes the transmission time period. The measured radio channel quality may be used as the radio channel quality for a transmission in the transmission time period of the TDD frame.

In 508, transmission power is allocated between the sub-bands at least on the basis of a relative radio channel qualities of the sub-bands and the coding rate used on the sub-bands.

Transmission power may be allocated to the sub-bands having a low channel quality and to the sub-bands having a high channel quality on the basis of the coding rate. Using the information of the coding rate transmission power may be allocated differently for those sub-bands that have a high quality and to those sub-bands that have a low quality. In this way the power allocation to a specific sub-band may be adjusted both based on the observed channel quality and the used coding rate. When transmission power is allocated to at least one, or even all sub-bands in this manner, frequency selective power control is achieved and radio channel characteristics of the sub-bands may be considered in the power allocation.

In an embodiment, a transmission on a frequency band may comprise encoded modulation symbols transmitted on a block of resources. A block of resources may be defined both in frequency and time dimensions, for example by a sub-band and a time period of allocation of the sub-band. In LTE, such a block is referred to as a Physical Resource Block (PRB) that comprises a group of 12 subcarriers that may be allocated for a duration of a two time slots, 1 ms altogether.

In an embodiment, reference signals are transmitted on the sub-bands. The reference signals may comprise Demodulation Reference Signals (DMRS) transmitted on a Physical Uplink Control Channel (PUCCH) or a Physical Uplink Shared Channel (PUSCH) as defined LTE specifications. Then, the transmission power allocation 508 may comprise allocating transmission power for sub-bands carrying reference signals and to sub-bands carrying encoded modulation symbols. In this way the power control used for the reference signals may be the same as for the transmitted symbols, thereby facilitating channel estimation at the receiving communications device, e.g. a base station.

In 510 the process ends, when the power is allocated for the data to be transmitted.

Figure 6:
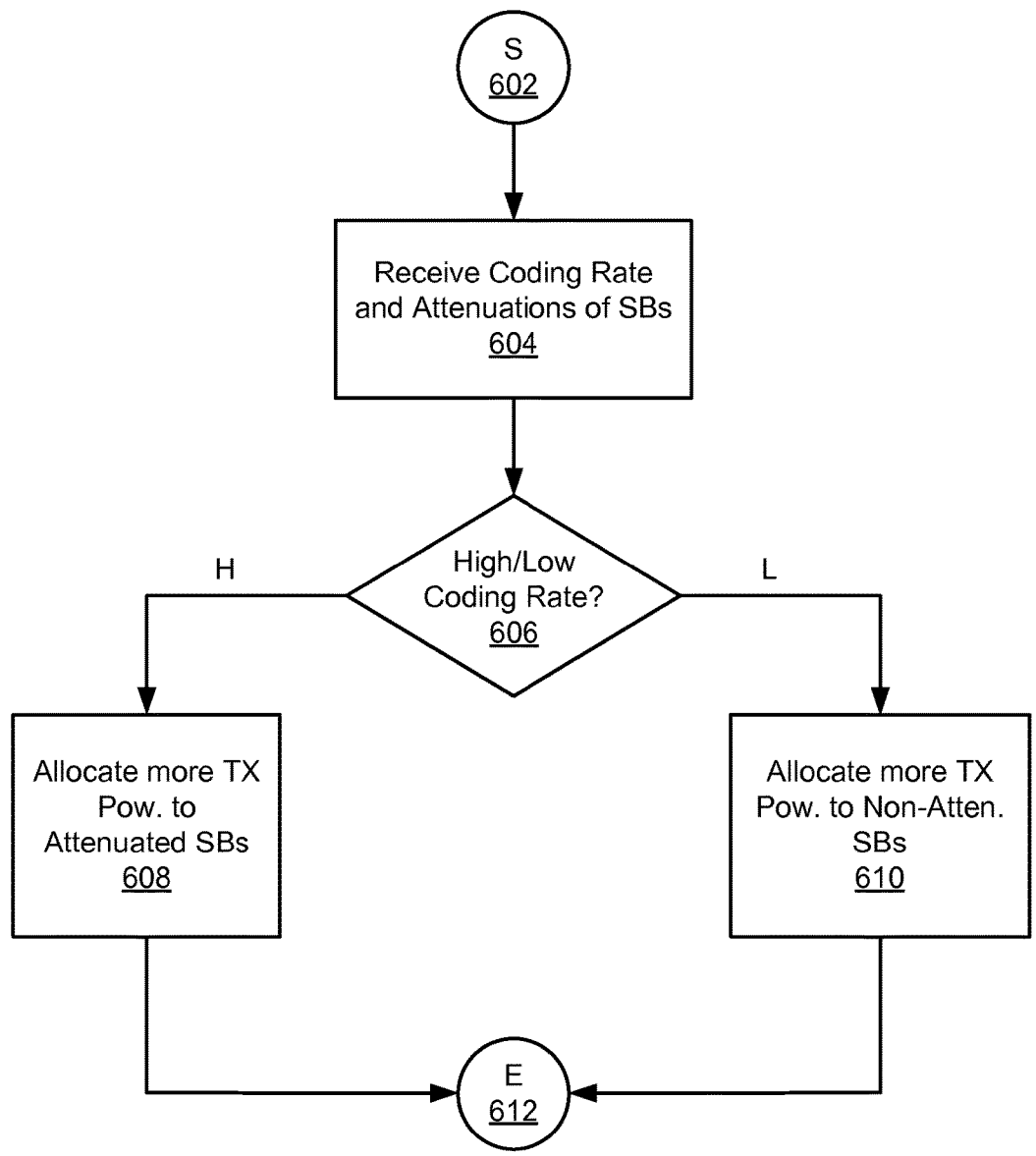
FIG. 6 illustrates a process of allocating transmission power to sub-bands having different channel qualities.

FIG. 6 illustrates a process of allocating transmission power to sub-bands having different channel qualities. In the illustrated process power is allocated in a frequency selective manner on the basis of the coding rate used for transmitted symbols and the channel qualities of the sub-bands.

The process may start 602 similar to explained in 502 of FIG. 5. In 604 a coding rate may be determined and radio channel qualities of sub-band may be determined as described in 504 and 506.

In steps 606 to 610 transmission power is allocated on the basis of the coding rate and proportional to the relative channel qualities of the sub-bands. In 606, when the coding rate is high, the radio transmission power is allocated inversely proportional to the relative radio channel qualities of the sub-bands. In 610, when the coding rate is low, the transmission power is allocated directly proportional to the relative radio channel qualities of the sub-bands.

When 606 the determined coding rate is high, a higher transmission power is allocated 608 to those sub-bands that have a low radio channel quality, than to those sub-bands that have a high radio channel quality. In this way the transmission power may be used to compensate for the low quality of the radio channel and failures in reception may be avoided or they may at least be correctable at the receiver by the error correction coding scheme. This supports maintaining spectral efficiency when symbols are transmitted over a plurality of sub-bands.

When 606 the determined coding rate is low, a higher transmission power is allocated 608 to those sub-bands that have a high radio channel quality, than to those sub-bands that have a low radio channel quality. In this way the transmission power may be used to compensate for the low quality of the radio channel and failures in reception may be avoided or they may at least be correctable at the receiver by the error correction coding scheme.

In an embodiment when 606 the determined coding rate is low, the second part of the sub-bands are left empty of allocated transmission power. Then, transmission power is only allocated to the sub-bands having a high radio channel quality.

In an embodiment, transmission power allocation between sub-bands involves a parameter that defines a difference between transmission powers allocated to one or more sub bands having a high radio channel quality and to one or more sub-bands having a low radio channel quality. In this way the difference of the transmission powers allocated to the sub-bands may be controlled. The parameter may define a maximum difference, for example.

Allocating less or even no transmission power to the sub-bands having a low radio channel quality provides more transmission power to be allocated to those sub-bands, that carry more payload bits, k. In this way, it may be provided that the spectral efficiency of the transmission of symbols over a plurality of sub-bands may be kept at a satisfying level.

In 612 the process ends, when the power is allocated for the data to be transmitted.

Figure 7:
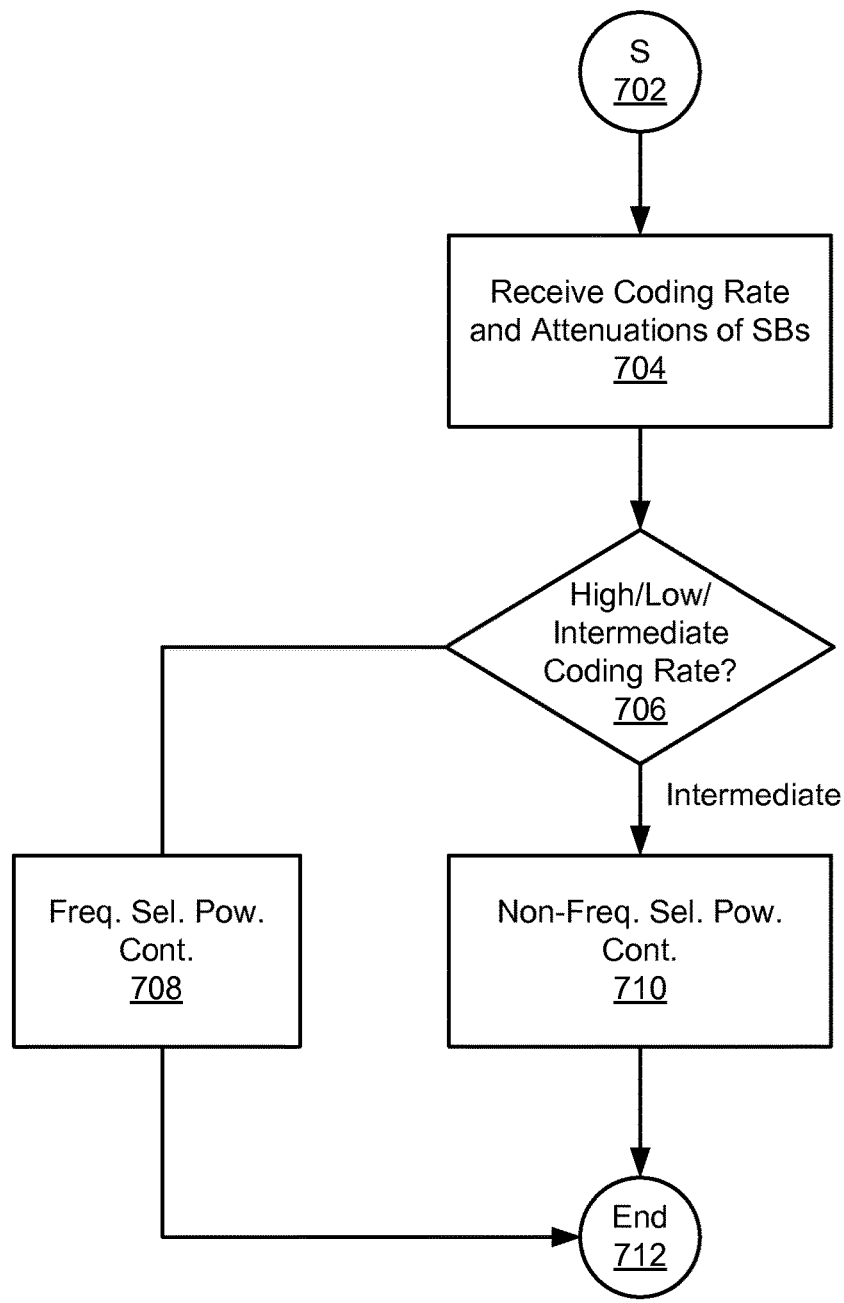
FIG. 7 illustrates a process of allocating transmission power to sub-bands, where a coding rate of an error correction coding scheme is used to determine whether frequency selective power control or non-frequency selective power control is used according to an embodiment.

FIG. 7 illustrates a process of allocating transmission power to sub-bands, where a coding rate of an error correction coding scheme is used to determine whether frequency selective power control or non-frequency selective power control is used according to an embodiment. In some situations channel quality information from the sub-bands may not be available or it may be incomplete, e.g. channel quality information is received regarding only some of the sub-bands. Then, transmission power control may be adapted to such situations facilitating the operation in both frequency selective and non-frequency selective manner.

The process may start 702 similar to explained in 502 of FIG. 5. In 704 a coding rate may be determined and radio channel qualities of sub-band may be determined as described in 704 and 706.

In 706 the transmission power allocation scheme is determined on the basis of the coding rate including three categories: a low, a high coding rate and an intermediate coding rate.

When the coding rate is low or high a frequency selective allocation of transmission power may be performed 708 for the sub-bands. In the frequency selective power allocation, the coding rate and channel quality is used to determine transmission power of the sub-band. The frequency selective power control may follow the process of FIG. 5 or 6.

When the coding rate is low or high a frequency non-selective allocation of transmission power may be performed 708 for the sub-bands. In the frequency non-selective power allocation a transmission power is determined the same for all the sub-bands. Then, a transmission power of a sub-band may be determined by dividing a total available transmission power with a number of sub-bands used for a transmission.

In the embodiments a total transmission power over the frequency band may be determined by various methods used in the present communications systems. For example for LTE uplink transmissions, the UE transmission power may be determined as:

$$P_t^i = \min\{P_m, 10 \log_{10}(M_i) + P_0 + \alpha L + \Delta_i + f_i\},$$

where $P_m$ maximum allowed transmit power of UE, depend on UE class

M number of allocated physical resource blocks $P_0$ cell specific initial power assignment α fractional power control parameter L is downlink path loss estimated at UE in dBm $\Delta_i$ UE specific offset (e.g. different MCS)

$f_i$ power correction provided by Open loop part of the FPC

In the above formula, the transmission power is determined as a total to all the sub-bands, i.e. Physical Resource Blocks (PRBs), where resources are allocated. Thereby, the number of PRBs allocated for each transmission equals the number of sub-bands. For the non-frequency selective power control, the total power may be evenly divided between the sub-bands. The above formula may also be used to determine the total available power for the frequency selective power allocation in 708. However, in the frequency selective power allocation the power is allocated between the sub-bands on the basis of the coding rate and the channel qualities of the sub-bands.

In 712 the process ends, when the power is allocated for the data to be transmitted.

When a process described above in any of the FIG. 5, 6 or 7 is executed, encoded modulation symbols may be transmitted on the sub-bands using the allocated transmission power on each of the sub-bands. It should be appreciated that in the above processes, every allocation of transmission power may concern only transmissions on the sub-bands in a specific time period, for example a subframe of 1 ms as in LTE. The time period may be defined by the time duration of the allocated transmission resource on the sub-band, e.g. by the time period (i.e. subframe) and frequency (i.e. PRB) of a scheduling unit in LTE. The scheduling unit may be a minimum scheduling unit, for example.

It should be appreciated that the above described embodiments provide an open loop power control scheme, whereby power control commands are not needed between communications devices that are engaged in the wireless communications.

When a power is allocated in frequency selective manner for a frequency band, the transmissions both coverage and link adaptation is improved for uplink OFDMA transmissions.

In an embodiment, a coding rate used in allocation of transmission power is associated with at least one threshold. The threshold may be used to determine, whether the coding rate is high or low. In one example the high coding rates comprise coding rates ½, ⅔ and ¾. Accordingly, the threshold for determining a high coding rate may be defined to include one or more or all of the high coding rates. Thus, the threshold may be defined as a coding rate higher or equal to ½, ⅔ and ¾.

When coding rates are categorized into high, low and intermediate categories, a low coding rate may be defined for example to include coding rates less than ½. A high coding rate may be defined for example to include the coding rate higher or equal to ¾. Then the coding rates between the high and low coding rates may be defined as intermediate coding rates, e.g. ½ and ⅔ form the set of example coding rates used above.

In an embodiment, a radio channel quality may be determined as low and/or high on the basis of a threshold for the radio channel quality.

Figure 8:
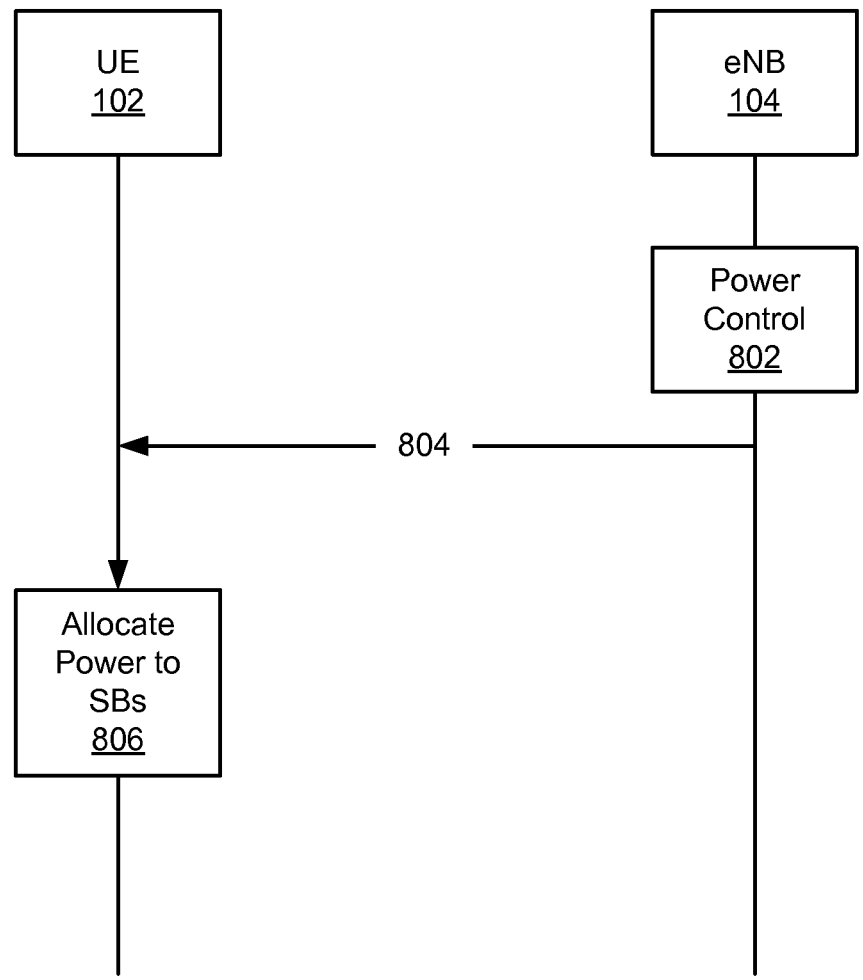
FIG. 8 illustrates a procedure of controlling allocation of transmission power between sub-bands according to an embodiment.

An embodiment involves an arrangement for wireless communications, where two devices communicate over a wireless medium. An example of the arrangement is described in FIG. 1, which is now used to explain a procedure according to an embodiment described in FIG. 8, where a procedure of controlling allocation of transmission power between sub-bands is illustrated. In the procedure, the devices may comprise a base station 104 and UE 102 of a wireless communications system, where access to the communications system is provided to the UE via BSs. Each BS may provide access on a coverage area, where radio signals from the BS may be received by UE. In one example the wireless communications system may comprise a communications system conforming to the LTE specifications defined by the 3GPP. In this context, BSs may be referred to eNodeBs.

Accordingly, in the illustrated scenario the UE is within the coverage are of the eNodeB. Within the coverage the UE can receive transmission from the eNodeB. These transmissions may comprise data and/or signaling. In one example the UE and the eNodeB connected by a connection allowing identification of the UE to the eNodeB. The connection may comprise a radio resource Control (RRC) protocol connection. RRC provides communications between the UE and the eNodeB on a signaling message of the RRC protocol. Accordingly, one or more signaling messages may be transmitted from the eNodeB to the UE.

In 802, the eNodeB performs a power control procedure that controls transmission power used by the UE. The controlling may comprise determining one or more parameters to be used by the UE in allocating transmission power to the sub-bands. Accordingly, the parameters may comprise at least one parameter for controlling allocation of transmission power between the sub-bands on the basis of relative radio channel qualities of the sub-bands and the coding rates used on the sub-bands.

The parameters may include one or more or a combination of a total transmission power of the UE, transmission power of the UE on a specific sub-band, power difference between sub-bands, a limit for a change in the transmission power, a threshold for a coding rate, a threshold for a radio channel quality, a request to use frequency selective power control, a request to use a non-frequency selective power control, a target reception power level and a parameter defining a difference between transmission powers allocated to sub bands.

Some frequency allocations may be required to conform to restrictions concerning changes in transmission power. Accordingly, the limit for a change in the transmission power facilitates conforming to such requirements, when it is used in allocating transmission power.

In 804 a signaling message including one or more power control parameters determined by the eNodeB is transmitted to the UE.

In 806 the UE may perform allocation of transmission power to the sub-bands on the basis of the parameters received from the eNodeB. The allocation of transmission power may be performed as described in the processes described with FIGS. 5, 6 and 7, for example.

In one embodiment, the UE receives the signaling message including information that a frequency selective power or non-frequency selective power control should be used. Then, the power control may be performed according to the process of FIG. 7 without the checking of the coding rate. Thus, the frequency selective power control of 708 or the non-frequency selective power control of 710 may be selected corresponding to the parameter received in the signaling message 804.

It should be appreciated that the eNodeB may send also further signaling message including power control parameters to the UE, whereby the steps 802, 804 and 806 are repeated. In one example the eNodeB is involved in the power control procedure, while the UE is within the coverage area of the eNodeB and served by the eNodeB for accessing the communications network.

It should be appreciated that the above processes may be repeated for each transmission made on the frequency band. In this way each transmission may be adapted to the most recent information of channel qualities on the sub-bands.

It should be appreciated that the apparatus illustrated in FIG. 2 may be connected with a communications device, for example a mobile phone, relay station and a base station. The apparatus may be included for example within such a communications device and connected to communications circuitry therein.

The steps/points, and related functions described above in FIGS. 5, 6, 7 and 8 are in no absolute chronological order, and some of the steps/points may be performed simultaneously or in an order differing from the given one. Other functions can also be executed between the steps/points or within the steps/points and other signaling messages sent between the illustrated messages. Some of the steps/points or part of the steps/points can also be left out or replaced by a corresponding step/point or part of the step/point.

The present invention is applicable to a transmitter, a mobile phone, relay station, a base station and/or to any communications device that communicates on a wireless medium. All words and expressions should be interpreted broadly and they are intended to illustrate, not to restrict, the described embodiments.

Apparatuses, such as a transmitter, a mobile phone, a relay station, a base station and/or to any communications device, or apparatuses implementing the functionality of a corresponding apparatus described with an embodiment may be implemented as an electronic digital computer, which may comprise a working memory (RAM), a central processing unit (CPU), and a system clock. The CPU may comprise a set of registers, an arithmetic logic unit, and a control unit. The control unit is controlled by a sequence of program instructions transferred to the CPU from the RAM. The control unit may contain a number of microinstructions for basic operations. The implementation of microinstructions may vary, depending on the CPU design. The program instructions may be coded by a programming language, which may be a high-level programming language, such as C, Java, etc., or a low-level programming language, such as a machine language, or an assembler. The electronic digital computer may also have an operating system, which may provide system services to a computer program written with the program instructions. The memory may be a volatile or a non-volatile memory, for example EEPROM, ROM, PROM, RAM, DRAM, SRAM, firmware, programmable logic, etc.

An embodiment provides a computer program embodied on a distribution medium, comprising program instructions which, when loaded into an electronic apparatus, constitute the functionality according to an embodiment.

The computer program may be in source code form, object code form, or in some intermediate form, and it may be stored in some sort of carrier, which may be any entity or device capable of carrying the program. Such carriers include a record medium, computer memory, read-only memory, electrical carrier signal, telecommunications signal, and software distribution package, for example. Depending on the processing power needed, the computer program may be executed in a single electronic digital computer or it may be distributed amongst a number of computers.

An apparatus according to an embodiment may also be implemented as one or more integrated circuits, such as application-specific integrated circuits ASIC. Other hardware embodiments are also feasible, such as a circuit built of separate logic components. A hybrid of these different implementations is also feasible.

Apparatuses, such as a transmitter, a mobile phone, a relay station, a base station and/or to any communications device, or apparatuses implementing the functionality of a corresponding apparatus described with an embodiment comprise not only prior art means, but also means for receiving a coding rate of an error correction coding scheme for encoding modulation symbols to be transmitted on sub-bands of a frequency band in radio communications, determining radio channel qualities of the sub-bands of the frequency band, and allocating transmission power between the sub-bands at least on the basis of relative radio channel qualities of the sub-bands and the received coding rate.

More precisely, the various means comprise means for implementing functionality of a corresponding apparatus described with an embodiment and it may comprise separate means for each separate function, or means may be configured to perform two or more functions. Present apparatuses comprise processors and memory that can be utilized in an embodiment. Programs, also called program products, including software routines, applets and macros, can be stored in any apparatus-readable data storage medium and they include program instructions to perform particular tasks. All modifications and configurations required for implementing functionality of an embodiment may be performed as routines, which may be implemented as added or updated software routines, application circuits (ASIC) and/or programmable circuits. Further, software routines may be downloaded into an apparatus.

For example, an apparatus according to an embodiment may be implemented in hardware (one or more apparatuses), firmware (one or more apparatuses), software (one or more modules), or combinations thereof. For a firmware or software, implementation can be through modules (e.g., procedures, functions, and so on) that perform the functions described herein. The software codes may be stored in any suitable, processor/computer-readable data storage medium(s) or memory unit(s) or article(s) of manufacture and executed by one or more processors/computers. The data storage medium or the memory unit may be implemented within the processor/computer or external to the processor/computer, in which case it can be communicatively coupled to the processor/computer via various means as is known in the art.

It will be obvious to a person skilled in the art that, as the technology advances, the inventive concept can be implemented in various ways. The invention and its embodiments are not limited to the examples described above but may vary within the scope of the claims.

The invention claimed is:

1. A method comprising:
  receiving a coding rate of an error correction coding scheme for encoding modulation symbols to be transmitted via a frequency band in radio communications, the frequency band including sub-bands;
  determining relative radio channel qualities of the sub-bands of the frequency band; and
  allocating transmission power between the sub-bands using one of a plurality of different frequency selective power allocation schemes based on the coding rate for encoding modulation symbols to be transmitted via the frequency band, including:
    a first frequency selective power allocation scheme, including, when the coding rate is high, allocating a higher transmission power to sub-bands that have a low radio channel quality than to sub-bands that have a high radio channel quality; and
    a second frequency selective power allocation scheme, including, when the coding rate is low, allocating a higher transmission power to sub-bands that have a high radio channel quality than to sub-bands that have a low radio channel quality.

2. The method according to claim 1, comprising:
  for the second frequency selective power allocation scheme, including, when the coding rate is low, only allocating transmission power to sub-bands that have a high radio channel quality, and allocating no transmission power to sub-bands that have a low radio channel quality.

3. The method according to claim 1, wherein a coding rate is associated with a threshold for determining a transmission power allocation scheme between the sub-bands.

4. The method according to claim 1, wherein transmission power is allocated on a basis of a parameter defining a difference between transmission power allocated between the sub-bands.

5. The method according to claim 1, wherein the transmission power is allocated to the sub-bands comprising one or more sub-bands carrying reference signals, and one or more sub-bands carrying encoded modulation symbols.

6. The method according to claim 1, comprising:
  obtaining modulation symbols to be transmitted;
  encoding the modulation symbols according to the error correction coding scheme; and
  transmitting the encoded modulation symbols on the sub-bands using the allocated transmission power.

7. The method according to claim 1, comprising:
receiving a resource allocation comprising the sub-bands of the frequency band;
receiving at least one target reception power level for transmissions on the sub-bands;
measuring channel quality of at least one of the sub-bands; and
allocating transmission power to the at least one of the sub-bands on a basis of the target reception power level and the measured channel quality and the coding rate.

8. The method according to claim 1, wherein a plurality of antennas are used to transmit the modulation symbols and antenna weights are determined on a basis of the transmission power allocated to the sub-bands.

9. The method according to claim 1, wherein a plurality of antennas are used to transmit the modulation symbols, wherein at least one target reception power level for transmissions on the sub-bands is received, and antenna weights are determined on a basis of the transmission power allocated to the sub-bands such that a transmission on a sub-band is received at a power level less or equal to the target reception power level for the sub-band.

10. The method according to claim 1, wherein a target reception power level is received to a plurality of sub-bands and the target reception power level of the corresponding sub-band is used in the allocation of transmission power to the corresponding sub-band.

11. The method according to claim 1:
defining a plurality of error correction coding schemes including at least three groups of coding rates, the groups comprising a low coding rate, an intermediate coding rate and a high coding rate;
allocating transmission power in a non-frequency selective manner to the sub-bands, when the coding rate comprises the intermediate coding rate; and
allocating transmission power in a frequency selective manner, when the coding rate comprises the low coding rate or the high coding rate.

12. The method according to claim 1, wherein transmission power is allocated on a basis of one or more parameters received in a signaling message over a wireless connection.

13. The method according to claim 1, wherein transmission power is allocated on a basis of parameters comprising one or more or a combination from a group comprising: a total transmission power, transmission power on a specific sub-band, power difference between sub-bands, a limit for a change in the transmission power, a threshold for a coding rate, a threshold for a radio channel quality, a request to use frequency selective power control, a request to use a non-frequency selective power control, a target reception power level and a parameter defining a difference between transmission powers allocated to sub bands.

14. The method according to claim 1, wherein a frequency selective allocation of transmission power comprises allocating transmission power to the sub-bands on a basis of the coding rate.

15. The method according to claim 1, wherein the error correction coding scheme comprises a forward error correction coding scheme, including at least one of a block code, a convolutional code and a turbo code.

16. The method according to claim 1, wherein the modulation symbols are transmitted in a transmission time period of a time division duplex, TDD, communications frame, and transmission power is allocated to the sub-bands on a basis of a measurement of a radio channel quality in a reception time period of the time division duplex, TDD, communications frame, said reception time period preceding the transmission time period.

17. An apparatus comprising:
a receiver configured to receive a coding rate of an error correction coding scheme for encoding symbols to be transmitted via a frequency band in radio communications, the frequency band including sub-bands;
a channel quality determiner configured to determine relative radio channel qualities of the sub-bands of the frequency band; and
a transmission power allocator configured to allocate transmission power between the sub-bands using one of a plurality of different frequency selective power allocation schemes based on the coding rate for encoding modulation symbols to be transmitted via the frequency band, including:
a first frequency selective power allocation scheme, including, when the coding rate is high, allocate a higher transmission power to sub-bands that have a low radio channel quality than to sub-bands that have a high radio channel quality; and
a second frequency selective power allocation scheme, including, when the coding rate is low, allocate a higher transmission power to sub-bands that have a high radio channel quality than to sub-bands that have a low radio channel quality.

18. An apparatus comprising at least one processor and at least one memory including computer instructions that, when executed by the at least one processor, cause the apparatus to:
receive a coding rate of an error correction coding scheme for encoding modulation symbols to be transmitted on sub-bands of a frequency band in radio communications;
determine relative radio channel qualities of the sub-bands of the frequency band; and
allocate transmission power between the sub-bands at least on a basis of the relative radio channel qualities of the sub-bands and the received coding rate;
wherein, based on the coding rate for the sub-bands, transmission power is allocated differently for sub-bands that have a high radio channel quality as compared to sub-bands that have a low radio channel quality;
when a coding rate for sub-bands is high, the transmission power is allocated inversely proportional to the relative radio channel qualities of the sub-bands; and
when a coding rate for sub-bands is low, the transmission power is allocated directly proportional to the relative radio channel qualities of the sub-bands.

* * * * *